(12) United States Patent
John

(10) Patent No.: US 8,514,645 B2
(45) Date of Patent: Aug. 20, 2013

(54) CURRENT-MODE SENSE AMPLIFIER FOR HIGH-SPEED SENSING

(75) Inventor: Leo Chemmanda John, Velacherry (IN)

(73) Assignee: Atmel Corporation, San Jose, CA (US)

( * ) Notice: Subject to any disclaimer, the term of this patent is extended or adjusted under 35 U.S.C. 154(b) by 64 days.

(21) Appl. No.: 13/324,402

(22) Filed: Dec. 13, 2011

(65) Prior Publication Data

US 2013/0148453 A1    Jun. 13, 2013

(51) Int. Cl.
*G11C 7/02*   (2006.01)

(52) U.S. Cl.
USPC ............... 365/210.1; 365/207; 365/185.21

(58) Field of Classification Search
USPC ............ 365/210.1, 207, 205, 210.14–210.15, 365/185.21
See application file for complete search history.

(56) References Cited

U.S. PATENT DOCUMENTS

| 7,084,671 | B1 | 8/2006 | Wendell et al. |
| 7,405,987 | B1 | 7/2008 | Moscaluk |
| 7,522,463 | B2 | 4/2009 | Pelli et al. |
| 7,724,595 | B2 | 5/2010 | Lin et al. |
| 7,990,792 | B2 | 8/2011 | Abe et al. |
| 8,014,221 | B2 * | 9/2011 | Lee ............................ 365/210.1 |

* cited by examiner

*Primary Examiner* — David Lam
(74) *Attorney, Agent, or Firm* — Fish & Richardson P.C.

(57) ABSTRACT

A sense amplifier circuit according to some implementations includes a differential input stage to receive mirrored input currents and a transistor switch whose state is controlled by a signal applied to its gate. The sense amplifier circuit includes a pair of cross-coupled NMOS transistors and a pair of cross-coupled PMOS transistors to which the mirrored input currents are coupled and whose drain nodes are shorted when the transistor switch is in a conductive state. The sense amplifier is arranged to generate a digital output signal indicative of which of the input currents is larger.

19 Claims, 5 Drawing Sheets

US 8,514,645 B2

CURRENT-MODE SENSE AMPLIFIER FOR HIGH-SPEED SENSING

TECHNICAL FIELD

The present disclosure relates to integrated circuits and, in particular, to current-mode sense amplifiers that facilitate high-speed sensing.

BACKGROUND

A sense amplifier is electronic circuitry that sometimes is included in a memory component in an electronic device to read the state of memory cells. Sense amplifiers commonly are used in memory cell arrays to sense the difference between a memory cell bit-line voltage/current and a reference cell bit-line voltage/current and to amplify the difference so as provide a rail-to-rail output voltage. This reading process depends on how much current a memory cell sinks under well-defined biasing conditions. The task of a sense amplifier is to transform this current information into binary information that is suitable to be used as internal digital memory data. In some cases, the binary information consists of two logical levels ("1" or "0"), which correspond, respectively, to the memory cell states in which the cell sinks or does not sink a current under well-defined biasing conditions.

One way to read the cell state is to compare the cell current ($I_{cell}$) with a reference current ($I_{ref}$), usually provided by another cell, and track the process characteristics of the memory cell. The reference cell usually sinks a current having a value placed between the cell current in the logical state "1" and the cell current in the logical state "0." For example, if the memory cell in the state "0" sinks no current, the reference cell could sink one half of the cell current in the logical state "1." The sense amplifier reads the difference between the cell current and the reference current, and transforms the difference into binary information suitable to be used by the other memory chip circuits. For example, the current difference can be positive or negative if the cell state is "1" or "0," respectively, so that the sense amplifier generates a binary signal "1" or "0," respectively.

Some sense amplifiers operate in two clock phases: an equalization phase and a sense-latch phase. In the equalization phase, the sense amplifier output is reset by equalizing the sense amplifier's differential outputs. During the sense-latch phase, the sense amplifier compares the two input voltages/currents and generates a differential output voltage corresponding to a logic '0' and '1'.

SUMMARY

The present disclosure relates to a current-mode sense amplifier that, in some implementation, can result in low power consumption, a reduced sensing time and small silicon area requirements for fabrication.

In one novel aspect, for example, a sense amplifier circuit includes a differential input stage to receive mirrored input currents and a transistor switch whose state is controlled by a signal applied to its gate. The sense amplifier circuit includes a pair of cross-coupled NMOS transistors and a pair of cross-coupled PMOS transistors to which the mirrored input currents are coupled and whose drain nodes are shorted when the transistor switch is in a conductive state. The sense amplifier is arranged to generate a digital output signal indicative of which of the input currents is larger.

Some implementations include one or more of the following features. For example, the sense amplifier circuit can include circuitry to provide a control signal to the gate of the transistor switch so that the drain nodes of the pairs of cross-coupled transistors become un-shorted a predetermined amount of time after commencement of a sensing phase. In some implementations, the sense amplifier circuit includes circuitry to disconnect a current mirror structure electrically from the pairs of cross-coupled transistors during at least part of the sensing phase. For example, the sense amplifier circuit can be arranged such that the current mirror structure is disconnected electrically from the pairs of cross-coupled transistors after a latching action of the cross-coupled pair of PMOS transistors has started and after output voltages of the sense amplifier circuit begin to transition to corresponding rail-to-rail values. The foregoing features can, in some cases, help reduce the sensing time.

In yet a further novel aspect, a method of operating a current-mode sense amplifier circuit is disclosed. The method includes mirroring a first current a second current onto different branches of the sense amplifier circuit during an equalization phase while common drain nodes of cross-coupled transistors in the sense amplifier circuit are electrically connected together. Subsequently, the common drain nodes are isolated electrically from one another for at least part of a sensing phase during which output voltages appearing at the common drain nodes begin to transition to rail-to-rail voltage values. After isolating the common drain nodes electrically from one another, a current mirror structure is disconnected electrically from the cross-coupled transistors to allow the output voltages to reach the rail-to-rail voltage values.

Other potential aspects, features and advantages will be readily apparent from the following detailed description, the accompanying drawings, and the claims.

DETAILED DESCRIPTION

The present disclosure describes a current-mode based sense amplifier for sensing differential currents and amplifying the difference to produce a digital output. The sense amplifier can be implemented, for example, as part of an integrated CMOS circuit. The current-mode sense amplifier described below can, in some implementations, provide high-speed sensing useful, for example, in non-volatile memory devices and other applications in which currents are compared and a digital output is provided.

As described in greater detail below, the sense amplifier 10 illustrated in FIG. 1 includes a differential input stage (i.e., NMOS transistors N1, N2) to receive the input currents mirrored on one side from a memory cell 12 and on the other side from a reference cell 14. The currents then are coupled through a pair of cross-coupled PMOS transistors (P1, P2) and a pair of cross-coupled NMOS transistors (N3, N4) whose drain nodes can be shorted using a switch (i.e., PMOS transistor P3). The sense amplifier 10 generates differential digital output signals OUT and $\overline{\text{OUT}}$ to indicate which of the differential input signals is larger.

Figure 1:
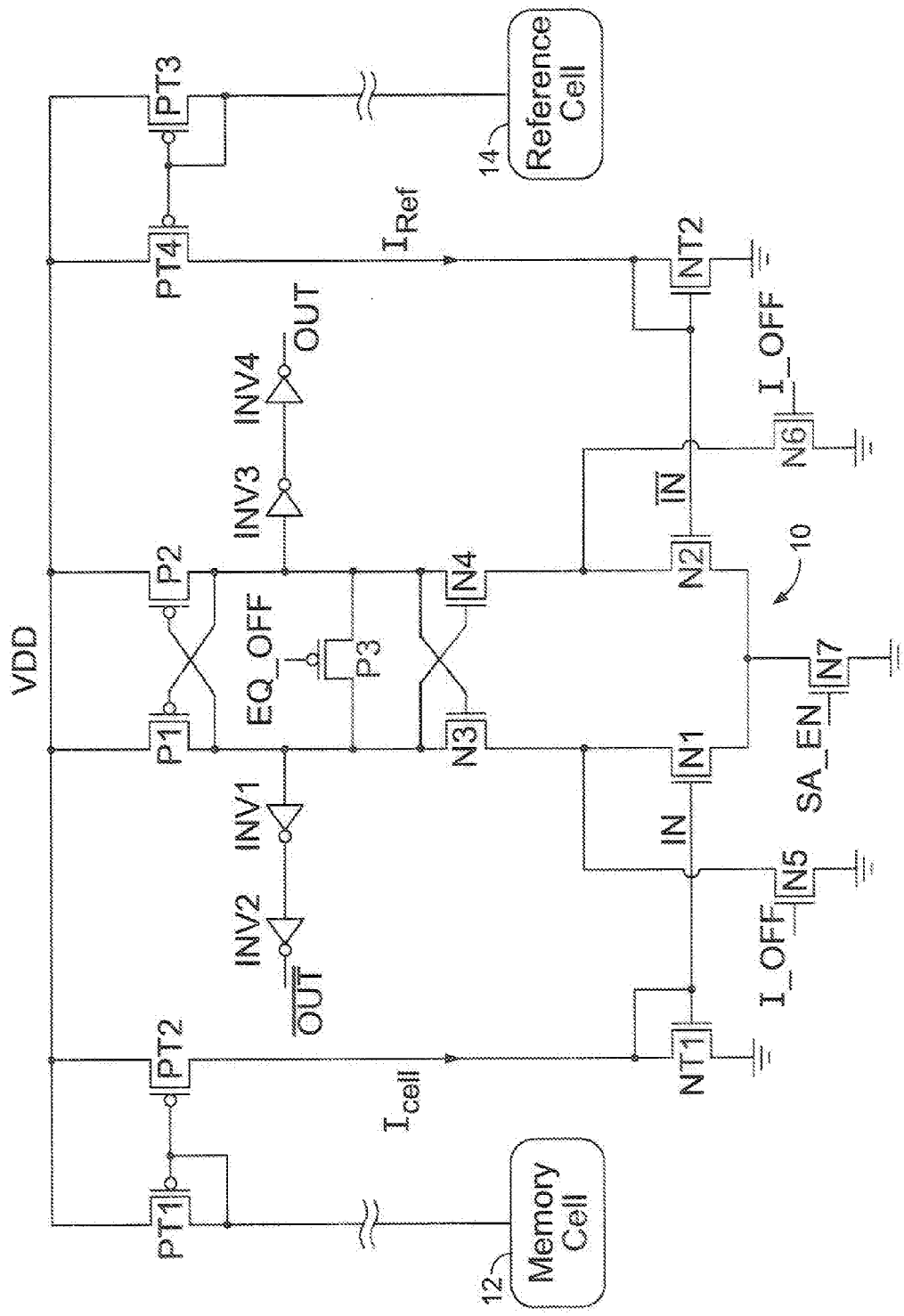
FIG. 1 is a circuit diagram including an example of a sense amplifier according to the invention.

In the example of FIG. 1, PMOS transistors PT1, PT2, and NMOS transistor NT1 carry the memory cell current ($I_{cell}$) and mirror this current onto the input transistor N1 of the sense amplifier 10. Likewise, PMOS transistors PT3, PT4, and NMOS transistor NT2 carry the reference current ($I_{ref}$) and mirror this current onto the input transistors N2 of the sense amplifier 10. In particular, the pairs of PMOS transistors PT1, PT2 and PT3, PT4 serve as current mirrors. Similarly, each of the NMOS transistors N1, N2 serves as one side of a respective current mirror consisting of a pair of NMOS devices (i.e., NT1, N1 or NT2, N2).

In some implementations, the transistors PT1-PT4 and NT1-NT2 form part of a separate functional block on the same integrated circuit as the sense amplifier 10. Nevertheless, the transistors NT1, NT2 also can be considered part of the sense amplifier 10 in view of the current mirroring function they perform together with the differential input stage transistors NMOS transistors N1, N2.

Figure 2:
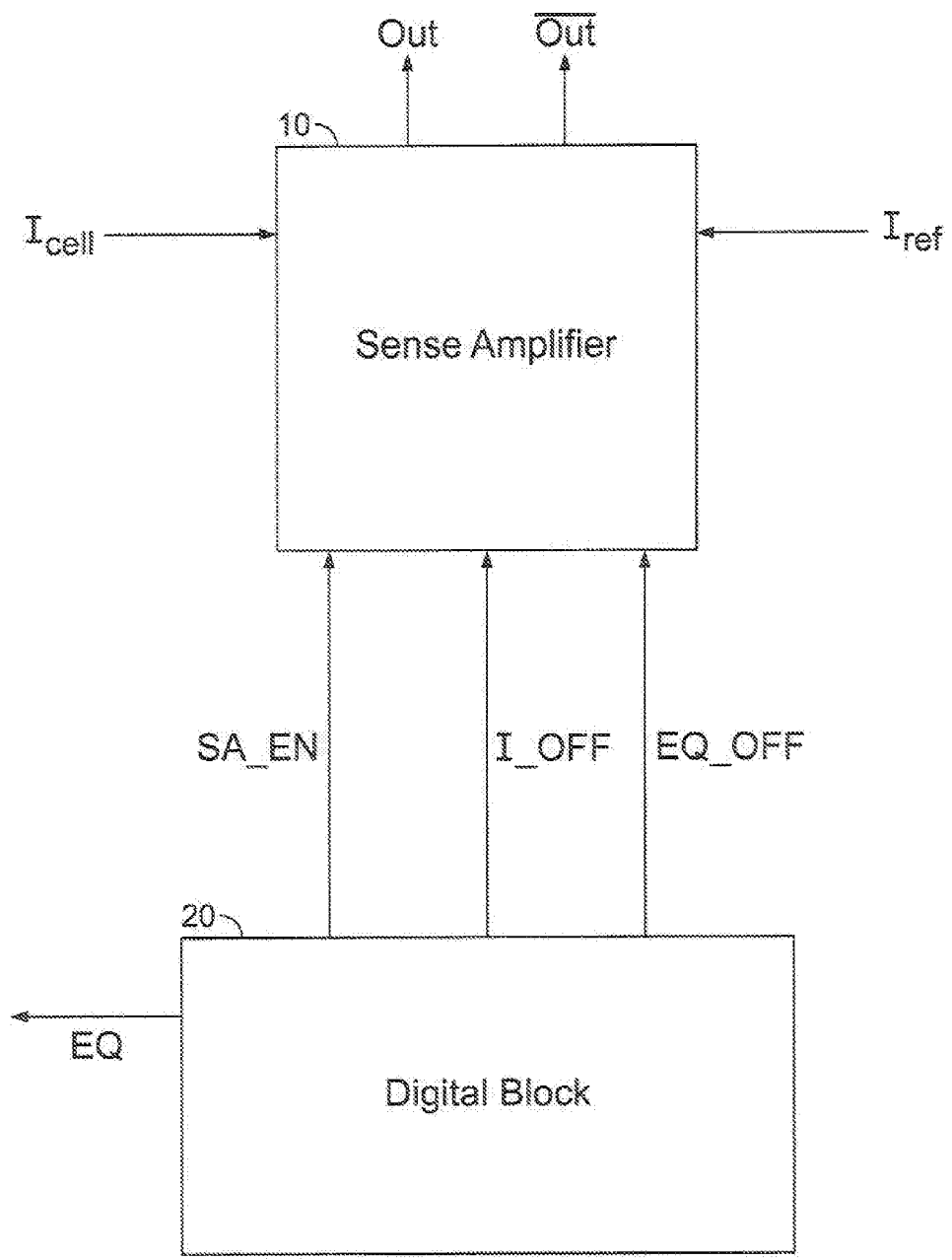
FIG. 2 is a block diagram illustrating various input, output and control signals associated with the sense amplifier.

In the illustrated example, the following control signals are provided to the sense amplifier 10: an enable signal (SA_EN) for the sense amplifier, a signal (EQ_OFF) to enable the switch P3, and a signal (I_OFF) to connect or disconnect the current mirror structure from the cross-coupled pairs of transistors. As shown in FIG. 2, these control signals can be generated from a digital block 20 that includes, for example, a microcontroller or other appropriate control circuitry. The control signals are explained in greater detail in the following paragraphs.

In the illustrated example, a NMOS transistor N7 is coupled between the sources of the input stage transistors N1, N2 and ground. The transistor N7 is controlled by the enable signal SA_EN to turn on and off the sense amplifier 10. For example, when the SA_EN signal is at a high level, the sense amplifier 10 is enabled. See FIG. 3.

The upper portion of the sense amplifier 10 includes the cross-coupled transistor pairs N3, N4 and P1, P2, which function to sense the differential currents and to amplify the small difference in the two currents to the corresponding rail-to-rail voltages so as to provide the digital outputs. The transistor P3 functions as a switch, which is used to maintain the same voltage at the differential outputs of the sense amplifier 10 during the equalization phase. In particular, during the equalization phase, the EQ_OFF signal is at a low level (see FIG. 3) so as to turn on the transistor P3 and maintain the same voltage at the differential outputs.

The sense amplifier 10 also includes circuitry to disconnect the current-mirror structure after the equalization phase. In particular, a pair of NMOS transistors N5, N6 is used to turn off the input stage devices N1, N2 after the equalization phase, thereby switching off the currents, which can help enhance the sensing speed of the sense amplifier. As illustrated in FIG. 1, the NMOS transistors N5 and N6 form a current-mirror switch-off mechanism which is controlled by the signal I_OFF. At a predetermined amount of time (T3+T4) following the end of the equalization phase (or a predetermined amount of time (T4) after the EQ_OFF signal goes high), the I_OFF signal transitions to a high level (see FIG. 3), thereby turning on the transistors N5, N6 and connecting the drains of the input stage devices N1, N2 to ground. In this way, the sensing time of the sense amplifier 10 can be enhanced, in some implementations by a factor of almost ten, as indicated by comparing the simulations of FIGS. 4A and 4B.

Figure 4A:
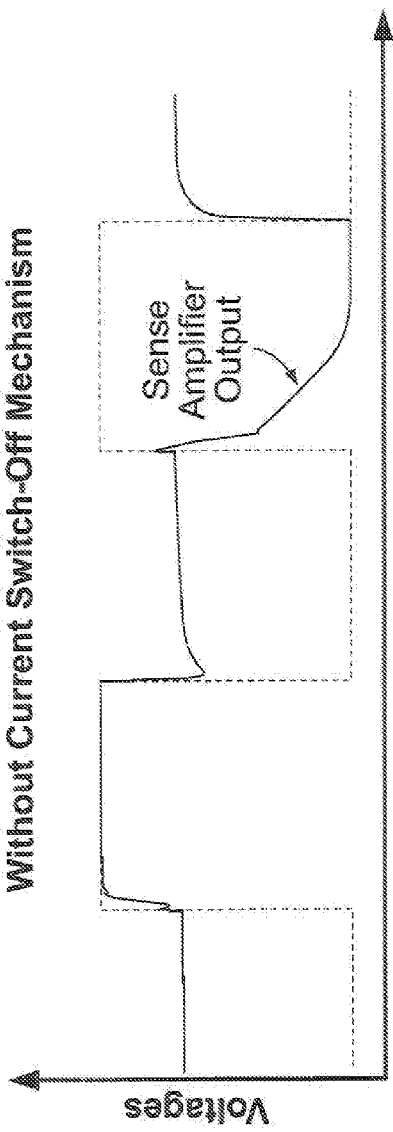
FIGS. 4A and 4B show examples of waveforms to illustrate the impact of disconnecting a current-mirror structure from the sense amplifier following the equalization phase.
Figure 4B:
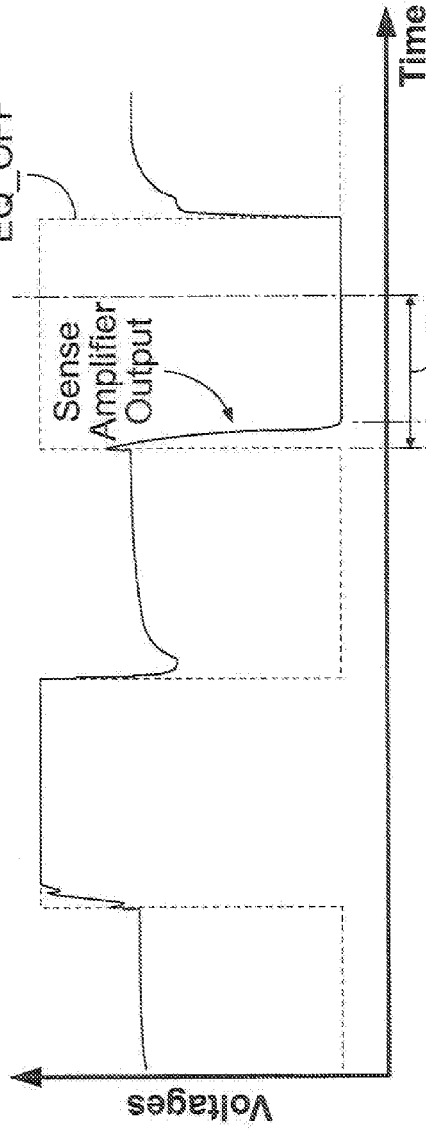

FIG. 4A illustrates an example of a waveform for the sense amplifier output signal (OUT) if the current-mirror structure is not disconnected after the equalization phase, whereas FIG. 4B illustrates an example of a waveform for the sense amplifier output signal (OUT) if the current-mirror structure is disconnected after the equalization phase. In FIGS. 4A and 4B, the solid line is the sense amplifier output waveform, and the dotted line is the digital control signal (EQ_OFF) whose positive edge indicates the PMOS switch P3 is turned off and the two output nodes are disconnected electrically from one another. The time T1 indicates the time for settling of the sense amplifier output in the presence of current-mirror switch-off mechanism, whereas the time T2 indicates the time for settling of the sense amplifier output in the absence of this mechanism. Thus, the sense amplifier output can settle much more quickly by disconnecting the current-mirror structure after the equalization phase.

The digital block 20 also generates an equalization pulse (EQ) which can be used in other parts of the circuitry and which specifies the timing and duration of the equalization phase.

Figure 3:
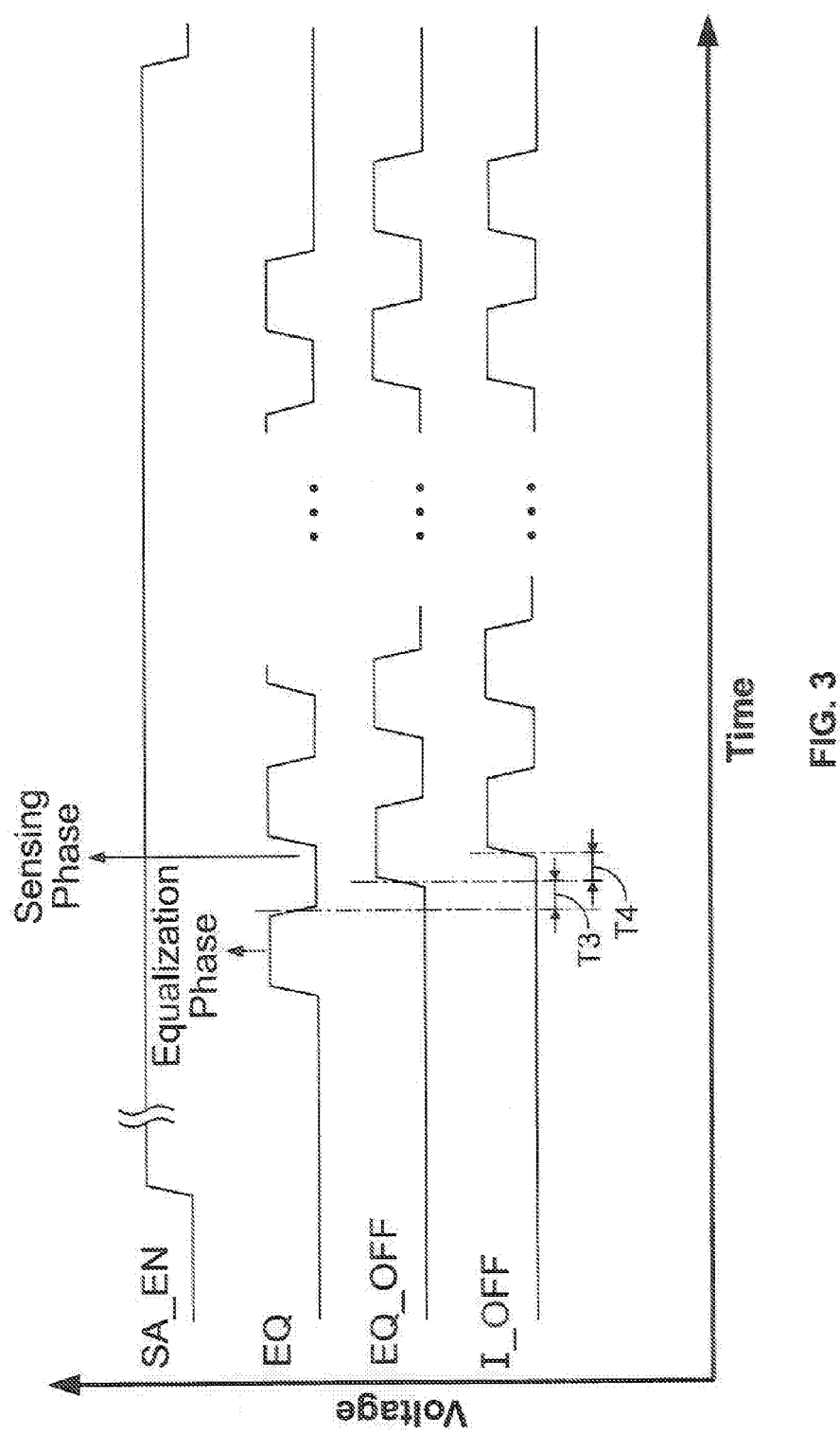
FIG. 3 illustrates an example of timing chart for various control signals provided to the sense amplifier.

The overall operation of the sense amplifier 10 can be divided into the following three main regions: (i) mirroring currents, (ii) sensing and (iii) zero current phase. In the first operating region, currents from the memory cell 12 and the reference cell 14 are mirrored onto the input devices N1, N2 of the sense amplifier (see FIG. 5, block 102). In FIG. 3, this region of operation is indicated as the "equalization phase." During this phase, the switch P3 remains on because the EQ_OFF signal is at a low level. Thus, as previously noted, during the equalization phase, the differential outputs are maintained at the same voltage level. The two currents ($I_{cell}$ and $I_{ref}$) that are mirrored onto the sense amplifier 10 set the gate-source voltage ($V_{gs}$) of the two NMOS cross-coupled transistors N3, N4 to the appropriate voltages according to the current magnitude in the respective arms of the sense amplifier 10. Hence, the arm that carries the higher current will have a higher gate-source voltage ($V_{gs}$) on its input stage device (N1 or N2) and, hence, more pull-down strength.

Figure 5:
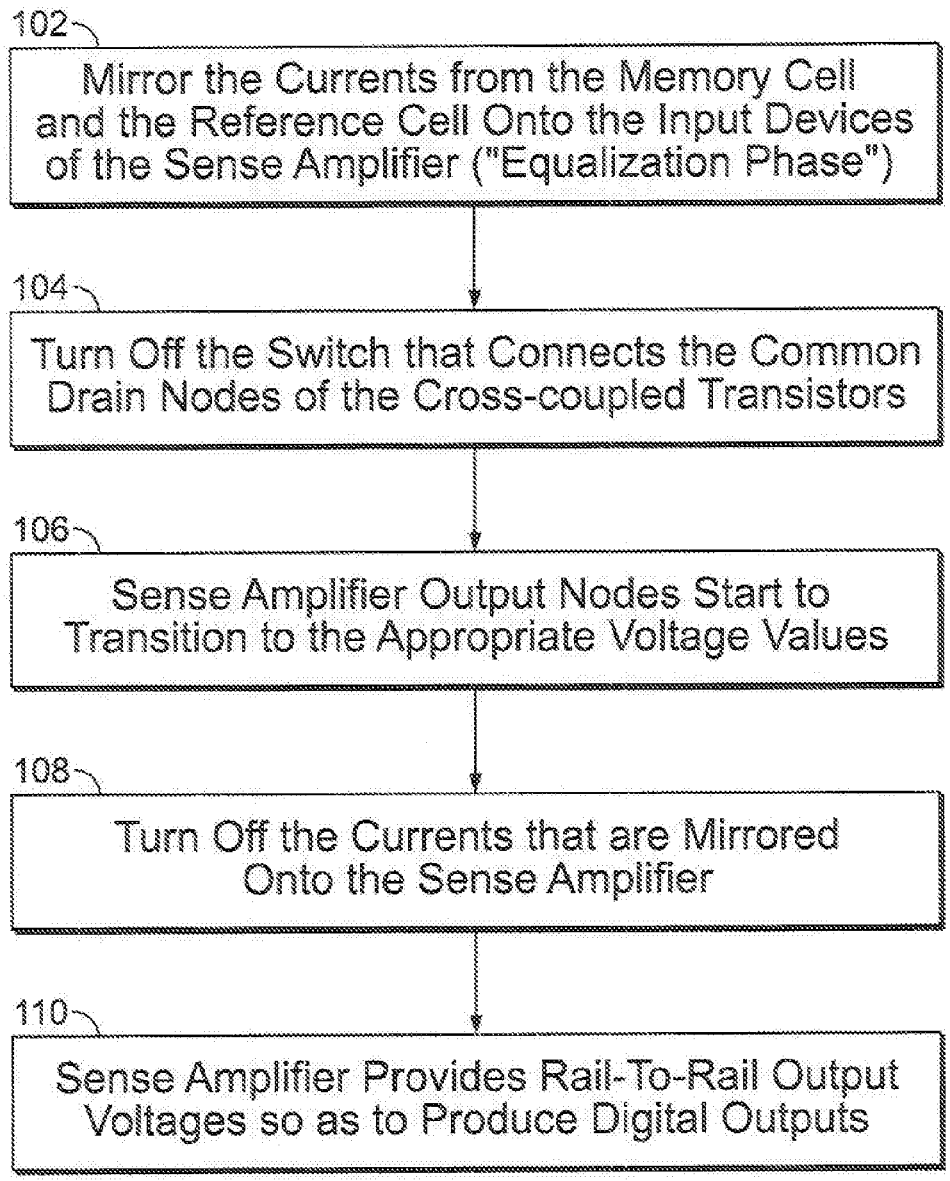
FIG. 5 is a flow chart of a method according to some implementations of the invention.

During the second operating region, the PMOS switch P3 is turned off (FIG. 5, block 104) after a predetermined time interval T3 from the negative edge of the equalization pulse EQ, as indicated in FIG. 3. This phase is indicated as the "sensing phase." As soon as the PMOS switch P3 is turned off (i.e., when the EQ_OFF signal goes to a high level), the top cross-coupled PMOS pair P1, P2 becomes active. With the initial difference in gate-source voltage ($V_{gs}$) of the NMOS pair N3, N4 previously set, the common drain node voltages of this cross-coupled pair are pulled up or down accordingly and then amplified by the PMOS cross-coupled pair P1, P2. The sense amplifier output nodes thus start transitioning to the appropriate rail-to-rail output voltage so as to produce digital outputs (FIG. 5, block 106). In the illustrated implementation, a respective pair of inverters in series (INV1, INV2 or INV3, INV4) is coupled to each drain node of the NMOS cross-coupled pair N3, N4. The digital outputs (OUT, $\overline{\text{OUT}}$) are provided at the output of the series inverters.

The third operating region takes place within the second operating region. In the third operating region, the currents that are mirrored onto the sense amplifier 10 are turned off using the signal I_OFF (FIG. 5, block 108). Turning on the transistors N5, N6 effectively disconnects the current mirror structure electrically from the other parts of the sense amplifier 10, including the pairs of cross-coupled transistors N3, N4 and P1, P2. Preferably, the signal I_OFF turns on the NMOS transistors N5, N6 at a predetermined time interval T4 during the sensing phase as shown in FIG. 3. Waiting this interval helps ensure that the latching action of the cross-coupled PMOS devices P1, P2 already has started and that the output voltages (OUT, $\overline{OUT}$) are transitioning to the corresponding rail-to-rail values. The presence of the mirrored current hampers the latching action of the PMOS cross-coupled pair P1, P2, thereby slowing down the process of generating the digital outputs. Thus, by turning on the NMOS devices N5, N6, the currents are cut-off, thereby speeding up the latching action so that the sense amplifier 10 provides the rail-to-rail output voltages more quickly (FIG. 5, block 110). Also, switching off the mirrored currents can help reduce the dynamic power consumption that the circuit otherwise would consume until the output voltages reach the rail-to-rail values.

In some implementations, the disclosed designs and techniques can provide advantages over some existing architectures in the area of lower power consumption. For example, in some implementations, the power is consumed only during the equalization phase, such that it too is a well-defined amount determined by the magnitudes of the currents $I_{cell}$ and $I_{ref}$ and the current-mirror ratio of the input stage. The cross-coupled structures and the current-mirror turn-off mechanism help ensure there is no current consumption once the input values are latched. Hence, the present architecture can be particularly useful for low-power applications. Second, the sensitivity of the sense amplifier for detecting smaller current differences can be enhanced by increasing the current-mirror ratio of the input stage. This feature can be particularly useful, for example, in applications in which the current difference between $I_{cell}$ and $I_{ref}$ is relatively small, such as is the case in some multi-level cell (MLC) applications. Furthermore, as a current-mode sense amplifier, the design can have improved speed compared to voltage-mode sense amplifiers.

Other implementations are within the scope of the claims.

What is claimed is:

1. A sense amplifier circuit comprising:
   a differential input stage to receive mirrored input currents;
   a transistor switch whose state is controlled by a signal applied to its gate; and
   a pair of cross-coupled NMOS transistors and a pair of cross-coupled PMOS transistors to which the mirrored input currents are coupled and whose drain nodes are shorted when the transistor switch is in a conductive state;
   wherein the sense amplifier is arranged to generate a digital output signal indicative of which of the input currents is larger.

2. The sense amplifier circuit of claim 1 including circuitry to provide the signal to the gate of the transistor switch so that the drain nodes of the pairs of cross-coupled transistors become un-shorted a predetermined amount of time after commencement of a sensing phase.

3. The sense amplifier circuit of claim 2 including circuitry to disconnect a current mirror structure electrically from the pairs of cross-coupled transistors during at least part of the sensing phase.

4. The sense amplifier circuit of claim 3 arranged such that the current mirror structure is disconnected electrically from the pairs of cross-coupled transistors after a latching action of the cross-coupled pair of PMOS transistors has started and after output voltages of the sense amplifier circuit begin to transition to corresponding rail-to-rail values.

5. The sense amplifier of claim 1 wherein the differential input stage comprises first and second NMOS transistors each of which receives a respective one of the input currents.

6. The sense amplifier circuit of claim 5 wherein each transistor in the pair of NMOS cross-coupled transistors includes a gate that is electrically connected to a drain of the other NMOS transistor in that cross-coupled pair.

7. The sense amplifier circuit of claim 6 wherein each transistor in the pair of cross-coupled PMOS transistors includes a gate that is electrically connected to a drain of the other PMOS transistor in that cross-coupled pair.

8. The sense amplifier circuit of claim 5 wherein the transistor switch comprises a PMOS transistor.

9. The sense amplifier circuit of claim 1 arranged to produce rail-to-rail voltage values at output nodes.

10. The sense amplifier circuit of claim 1 arranged to produce digital output signals.

11. The current-mode sense amplifier circuit of claim 1 wherein the differential input stage comprises first and second NMOS transistors, each of which forms part of a respective current mirror.

12. The sense amplifier circuit of claim 11 further comprising circuitry arranged to disconnect the current mirrors electrically from the pairs of cross-coupled transistors during at least part of a sensing phase.

13. The sense amplifier circuit of claim 11 further comprising circuitry arranged to disconnect the current mirrors electrically from the pairs of cross-coupled of transistors a predetermined amount of time after the transistor switch is turned off.

14. A method of operating a current-mode sense amplifier circuit, the method comprising:
   mirroring a first current and a second current onto different branches of the sense amplifier circuit during an equalization phase while common drain nodes of cross-coupled transistors in the sense amplifier circuit are electrically connected together;
   subsequently isolating the common drain nodes electrically from one another for at least part of a sensing phase during which output voltages appearing at the common drain nodes begin to transition to rail-to-rail voltage values; and
   after isolating the common drain nodes electrically from one another, disconnecting a current mirror structure electrically from the cross-coupled transistors to allow the output voltages to reach the rail-to-rail voltage values.

15. The method of claim 14 wherein the current mirror structure is disconnected electrically from the pairs of cross-coupled transistors after a latching action of a cross-coupled pair of PMOS transistors has started and after the output voltages of the sense amplifier circuit begin to transition to the rail-to-rail voltage values.

16. The method of claim 14 including providing a control signal to a gate of a transistor so as to isolate the common drain nodes from one another.

17. The method of claim 14 including providing a control signal to respective gates of transistors so as to disconnect the current mirror structure electrically.

18. The method of claim 14 wherein the first current corresponds to a memory cell value and the second current corresponds to a reference cell value.

19. An apparatus comprising:
   a memory cell and a reference cell;
   a current-mode sense amplifier;
   circuitry to mirror a first current representative of a the memory cell and a second current representative of the reference cell onto different branches of the sense amplifier during an equalization phase while common drain nodes of cross-coupled pairs of transistors in the sense amplifier are electrically connected together;
   circuitry to isolate the common drain nodes electrically from one another for at least part of a sensing phase during which output voltages appearing at the common drain nodes begin to transition to rail-to-rail voltage values; and circuitry to disconnect a current mirror structure electrically from the pairs of cross-coupled transistors during at least part of the sensing phase after isolating the common drain nodes electrically from one another.

* * * * *

UNITED STATES PATENT AND TRADEMARK OFFICE
CERTIFICATE OF CORRECTION

PATENT NO. : 8,514,645 B2
APPLICATION NO. : 13/324402
DATED : August 20, 2013
INVENTOR(S) : Leo Chemmanda John It is certified that error appears in the above-identified patent and that said Letters Patent is hereby corrected as shown below:

1.) On the title page, Item (75) Inventor: delete "Velacherry" and insert --Velachery--.

In the Specification

2.) Column 2, Line 18: after "first current", insert --and--.

In the Claims

3.) Column 5, Claim 5, Line 61: after "sense amplifier", insert --circuit--.

4.) Column 6, Claim 13, Line 22: after "cross-coupled", delete "of".

5.) Column 6, Claim 19, Line 60: after "representative of", delete "a".

Signed and Sealed this
Fifth Day of November, 2013

Teresa Stanek Rea
*Deputy Director of the United States Patent and Trademark Office*